Figure 1:
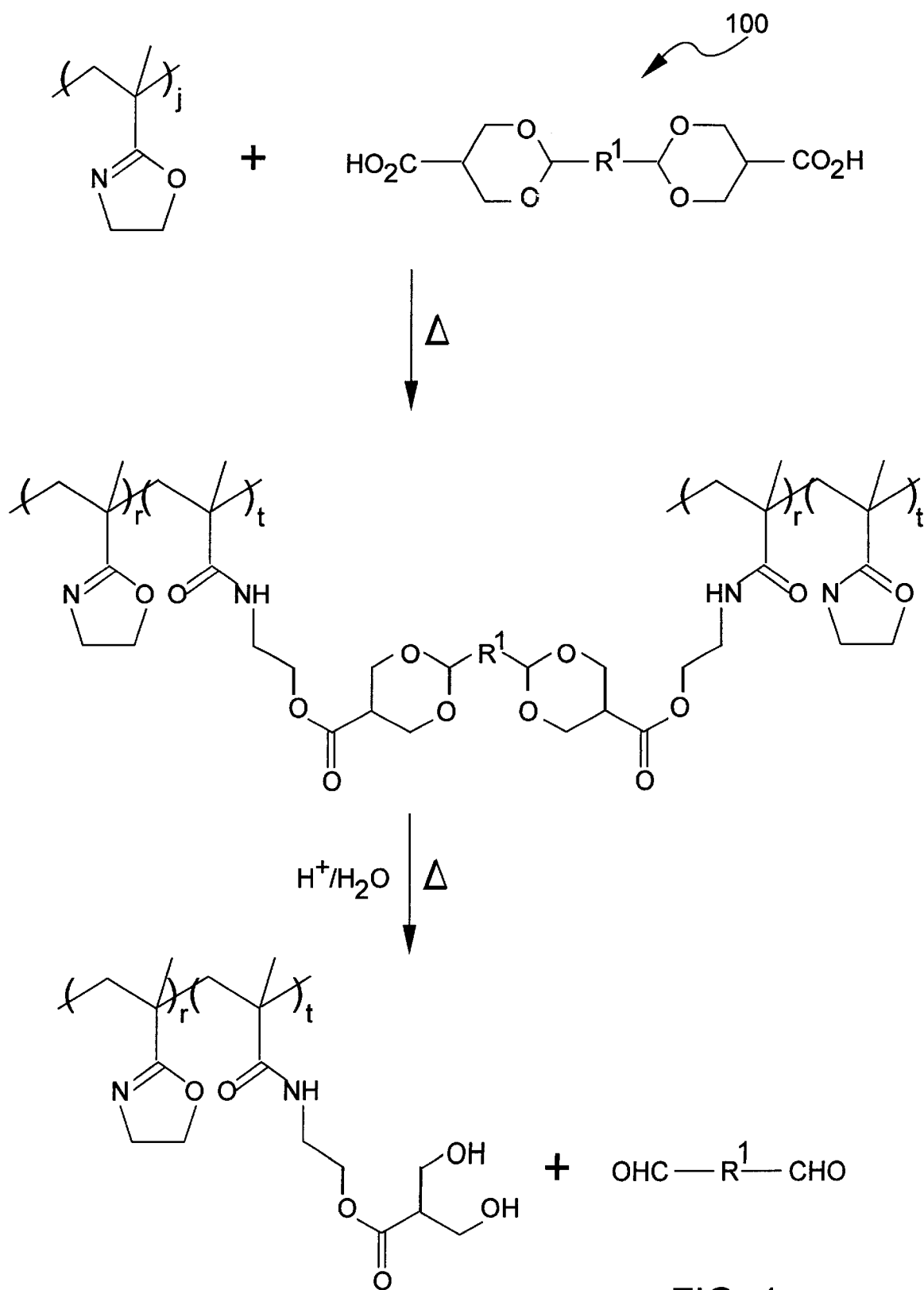

United States Patent [19]
Holmes et al.

[11] Patent Number: 6,110,653
[45] Date of Patent: Aug. 29, 2000

[54] ACID SENSITIVE ARC AND METHOD OF USE

[75] Inventors: Steven J. Holmes, Milton; Paul A. Rabidoux, Winooski, both of Vt.

[73] Assignee: International Business Machines Corporation, Armonk, N.Y.

[21] Appl. No.: 09/360,935

[22] Filed: Jul. 26, 1999

[51] Int. Cl.[7] ..................................................... G03F 7/26
[52] U.S. Cl. ........................ 430/325; 430/326; 430/328; 430/271.1
[58] Field of Search ..................................... 430/325, 326, 430/271.1, 328

[56] References Cited

U.S. PATENT DOCUMENTS

| | | | |
|---|---|---|---|
| 5,147,758 | 9/1992 | Smothers et al. | 430/281 |
| 5,278,031 | 1/1994 | Boggs et al. | 430/348 |
| 5,334,489 | 8/1994 | Grasshoff et al. | 430/335 |
| 5,364,741 | 11/1994 | Huynh-Tran et al. | 430/300 |
| 5,529,888 | 6/1996 | Watanabe et al. | 430/311 |
| 5,593,725 | 1/1997 | Park et al. | 430/160 |
| 5,635,333 | 6/1997 | Petersen et al. | 430/311 |
| 5,759,755 | 6/1998 | Park et al. | 430/512 |

OTHER PUBLICATIONS

Derwent WPI Patent Abstract, Patent No. JP 7160002 A, Jun. 23, 1995.
Havard et al., "Design of a Positive Tone Water–Soluble Resist," SPIE vol. 3049, pp. 437–447, 1997.
Yamada et al., "Positive and Negative Tone Water Processable Photoresists: A Progress Report," SPIE vol. 3333, pp. 245–253, 1998.
Taguchi et al., "Highly Sensitive Positive Resist Based on Vinyl Ether Chemistry," J. Vac. Sci. Technol. B. vol. 13, No. 6, pp. 2972–2974, Nov./Dec. 1995.
Havard et al., "The Design and Study of Water–Soluble Positive–and Negative–Tone Imaging Materials," SPIE vol. 3333, pp. 111–121, 1998.

*Primary Examiner*—Janet Baxter
*Assistant Examiner*—Rosemary Ashton
*Attorney, Agent, or Firm*—Schmeiser, Olsen & Watts; William D. Sabo

[57] ABSTRACT

A composition used to form an acid sensitive antireflective coating (ARC) includes a water soluble resin and a cross-linker. Radiation adsorptive components may be provided as part of the resin or, more preferably, as a separate dye. The composition may be applied on a substrate as a radiation adsorbing layer and additionally cross-linked to form an acid sensitive, water insoluble ARC on which a photopatterning resist (PPR) layer may be formed. Being acid sensitive, selected portions of an ARC formed from the composition may be removed by a suitable reversal of the cross-linking followed by a develop step, preferably with an aqueous developer, more preferably de-ionized water. The water soluble resin is preferably hydroxystyrene-sulfonated styrene copolymer, poly(2-isopropenyl-2-oxazoline), or poly(acrylic acid), the cross-linker is preferably an acetal diacid or a water soluble divinyl ether, and the dye is preferably 9-anthracene methanol or a squaric acid derivative. If a suitable photoacid generator (PAG) is included then an ARC formed from such components may exhibit a photosensitivity similar to or even lower than that of the overlying PPR. The photosensitivity is preferably less than about 900 $mJ/cm^2$, more preferably 100 $mJ/cm^2$ or less.

16 Claims, 6 Drawing Sheets

ACID SENSITIVE ARC AND METHOD OF USE

BACKGROUND OF THE INVENTION

1. Technical Field

This invention relates to the field of antireflective coatings. More specifically, the invention relates to an acid sensitive antireflective coating and its method of use.

2. Background Art

In the production of semiconductor devices, an integrated circuit substrate is coated with a film of photo patterning resist, exposed to actinic radiation, and developed to define a resist image over the integrated circuit substrate. The resist image includes both lines and spaces, wherein portions of the photo patterning resist that are removed form the spaces and the portions that remain form the lines. The resist image is transferred to the integrated circuit substrate by modifying the exposed portion of the substrate. Such modification may be performed by removal of a portion of the substrate by etching processes, by implantation of atomic species into the substrate, or by other methods known to those skilled in the art. During such processes, the photo patterning resist lines act as a mask to prevent modification of the portions of the substrate underlying the resist lines. Resolution of the image transferred to the substrate is dependent on the resolution of the resist image.

During exposure of a photo patterning resist on an integrated circuit substrate, some reflection of the actinic radiation off the integrated circuit substrate will typically occur. The reflection causes film interference effects that change the effective exposure intensity within a chip, across the wafer, and from wafer to wafer. Given the variation in effective exposure intensity, an unacceptable amount of line width variation typically occurs. This is especially true in modem manufacturing where laser exposure tools are used as the source of the actinic radiation and reflection is particularly prevalent.

To prevent reflection of actinic radiation into a photo patterning resist, one or more layers of an antireflective coating (ARC) may be provided between a substrate and a photo patterning resist film. ARCs often include a radiation adsorbing dye dispersed in a polymer binder, however, some polymers exist that contain an appropriate chromophore that sufficiently adsorbs the actinic radiation such that an additional adsorbing dye is not required. The ARC may be adapted to attenuate a particular wavelength of radiation used to expose the photo patterning resist by a selection of suitable adsorbing dies or a polymer having suitable chromophores.

Unfortunately, the use of an ARC creates its own problems. Once the photo patterning resist film is developed, exposing the underlying ARC, the ARC must be removed to expose the underlying integrated circuit substrate for subsequent modification as mentioned above. Commonly, the ARC is removed using a reactive ion etch process, however, other types of dry etching or wet etching as known to those skilled in the art may be used.

Regardless of the method selected for removing the ARC, there is a strong tendency for such processes to degrade the resist image by rounding off the corners, changing the line width, and creating other nonuniformities across the wafer or wafer to wafer. In particular, such processes may result in undercut and possible partial liftoff of the photo patterning resist film, causing etch bias, profile changes, photo patterning resist thinning, and other photo patterning resist defects as described in U.S. Pat. No. 5,635,333, issued to Petersen et al. While Petersen et al., and perhaps other references, attempt to resolve a portion of the above described problems, they are only partially effective at doing so.

Therefore there existed a need to provide a method and/or composition for forming an ARC that may be removed without degrading the resist image and that provides simplification of the complex processing steps recited by Petersen et al. and perhaps other references.

DISCLOSURE OF INVENTION

According to the present invention, a composition is provided including a water soluble resin and a cross-linker, wherein the composition may be cross-linked and will thus form an acid sensitive, water insoluble antireflective coating (ARC). By way of example, the composition may further include a dye selected from among 9-anthracene methanol and a squaric acid derivative. Also, the water soluble resin may be selected from among hydroxystyrene-sulfonated styrene copolymer, poly(2-isopropenyl-2-oxazoline), and poly(acrylic acid) and the cross-linker may be selected from among an acetal diacid and a water soluble divinyl ether. Particular advantages are achieved when the composition further includes chemical amplification components sufficient to produce a photosensitivity of less than about 900 millijoules per square centimeter ($mJ/cm^2$), especially about 100 $mJ/cm^2$ or less.

The present invention further provides a method including the steps of applying a radiation adsorbing layer on a substrate and forming an acid sensitive, water insoluble ARC therefrom, applying a photo patterning resist (PPR) layer on the ARC, exposing part of the PPR layer to actinic radiation, developing the PPR layer to form a resist image, rendering the ARC water soluble, and developing the ARC to uncover selected portions of the substrate. By way of example, the composition described above may be used as the radiation adsorbing layer. Also, for example, the step of developing the ARC may be performed with a water rinse. In addition, the steps of exposing the PPR layer and rendering the ARC water soluble may occur together in a single exposure to actinic radiation. Further, the steps of developing the PPR layer and developing the ARC may occur together in a single develop. Finally, the step of rendering the ARC water soluble may be accomplished by exposing the ARC to an acid solution or an acid vapor, by exposing the ARC to actinic radiation without first hardening the PPR layer, or by other methods.

The foregoing and other features and advantages of the present invention will be apparent from the following more particular description of preferred embodiments of the Invention, as illustrated in the accompanying drawings.

MODE(S) FOR CARRYING OUT THE INVENTION

According to a preferred embodiment of the present invention, a composition is provided that includes a water soluble resin and a cross-linker. Radiation adsorptive components may be provided as part of the resin or, more preferably, as a separate dye. Such a composition may be used as an acid sensitive antireflective coating (ARC), that is, the composition may be applied on a substrate as a radiation adsorbing layer and additionally cross-linked to form an acid sensitive, water insoluble ARC on which a photopatterning resist (PPR) layer may be formed. Being acid sensitive, selected portions of an ARC formed from the composition may be removed by a suitable reversal of the cross-linking followed by a develop step, preferably with an aqueous developer, more preferably de-ionized water.

The water soluble resin is preferably poly(2-isopropenyl-2-oxazoline) (hereinafter PIO), a hydroxystyrene-sulfonated styrene copolymer (hereinafter HSS copolymer), or poly(acrylic acid) (hereinafter PAA). The cross-linker is preferably an acetal diacid or a water soluble divinyl ether. The dye is preferably 9-anthracene methanol (9-AM) or a derivative of squaric acid having suitable dye properties. If a suitable photoacid generator (PAG) is included, then an ARC formed from such components may exhibit a photosensitivity similar to or even lower than that of the overlying PPR. That is, the exposure dose of actinic radiation required to cause the desired photo response in the overlying PPR layer to form a resist image is similar to the exposure dose of actinic radiation that will reverse the cross-linking of the water soluble resin in the ARC. This is a tremendous improvement over conventional ARCs, which are typically not photo sensitive.

While some attempts have been made to provide a photosensitive ARC, the ARCs are only marginally photo sensitive, requiring an exposure dose much higher than a typical PPR. For example, U.S. Pat. No. 5,635,333, issued to Petersen et al., discloses an ARC which requires an exposure dose in excess of 1.0 Joule per square centimeter. In the present invention, the photosensitivity is preferably less than about 900 millijoules per square centimeter ($mJ/cm^2$). The present invention also includes ARCs having enhanced photosensitivity made possible by chemical amplification such that photosensitivity is more preferably about 100 $mJ/cm^2$ or less. Derivatives of squaric acid, especially squarate salts, may be included to function as dyes, as acid amplifiers catalyzed by a photoacid from a PAG, or as both. Chemical amplification is preferably provided by inclusion of such a squaric acid derivative.

A method according to a preferred embodiment of the present invention begins with the step of applying a radiation adsorbing layer on a substrate and forming an acid sensitive, water insoluble ARC therefrom. Next, a PPR layer is applied on the ARC, selected portions of the PPR layer are exposed to actinic radiation, and the PPR layer is developed to uncover selected portions of the ARC. Additionally, either separate from the above steps or in combination therewith, the preferred method includes the steps of rendering the ARC water soluble and developing the ARC to uncover selected portions of the substrate. The only requirement of the radiation adsorbing layer described in the preferred method is that it be capable of forming an acid sensitive, water insoluble ARC and being rendered water soluble. Any composition known to those skilled in the art capable of providing such characteristics may be used, however, the radiation adsorbing layer preferably is a composition that includes a water soluble resin and a cross-linker and, more preferably, also includes a dye. Also, the radiation adsorbing layer and PPR layer may be applied using any method known to those skilled in the art, such as spin applying or other methods.

While a variety of water soluble resins and cross-linkers may be suitable for the composition used to form to the radiation adsorbing layer, preferable examples of water soluble resins and cross-linkers are described and tested in Taguchi et al., "Highly Sensitive Positive Resist Based on Vinyl Ether Chemistry," J. Vac. Sci. Technol. B, 13(6), pp. 2972–4, 1995; Havard et al., "Design of a Positive Tone Water-Soluble Resist," SPIE Vol. 3049, pp. 437–447, 1997; Havard et al., "The Design and Study of Water-Soluble Positive- and Negative-Tone Imaging Materials," SPIE Vol. 3333, pp. 111–121, 1998; and Yamada et al., "Positive and Negative Tone Water Processable Photoresists: A Progress Report," SPIE Vol. 3333, pp. 245–253, 1998, each of which is incorporated herein by reference for its pertinent and supportive teachings. Even though the references are directed toward a water soluble resist composition, rather than an ARC, it has been discovered that the water soluble resins and cross-linkers disclosed therein are surprisingly useful in formulating compositions for radiation adsorbing layers.

Preferably, the new composition includes suitable radiation adsorptive components and is otherwise formulated such that it can be used to form an acid sensitive, water insoluble ARC in keeping with the principles described herein. Accordingly, PIO, HSS copolymer, and PAA, and their derivatives compatible with the requirements set forth herein, are preferred as the water soluble resin. PIO is more preferred than PAA as the water soluble resin due to its pH compatibility with other components that preferably are in the composition used to form the radiation adsorbing layer of the present invention, as described below. PAA is more acidic than PIO and may cause shelf life problems. However, HSS copolymer is most preferred over both PIO and PAA. The ARC is acid sensitive and acid chemistry is preferably used to reverse the cross-linking of the water soluble resin used to form the ARC. PIO is somewhat basic, potentially interfering with the acid chemistry of the cross-linking reversal and also with any acid chemistry of the resist at the ARC/PPR layer interface.

Figure 2:
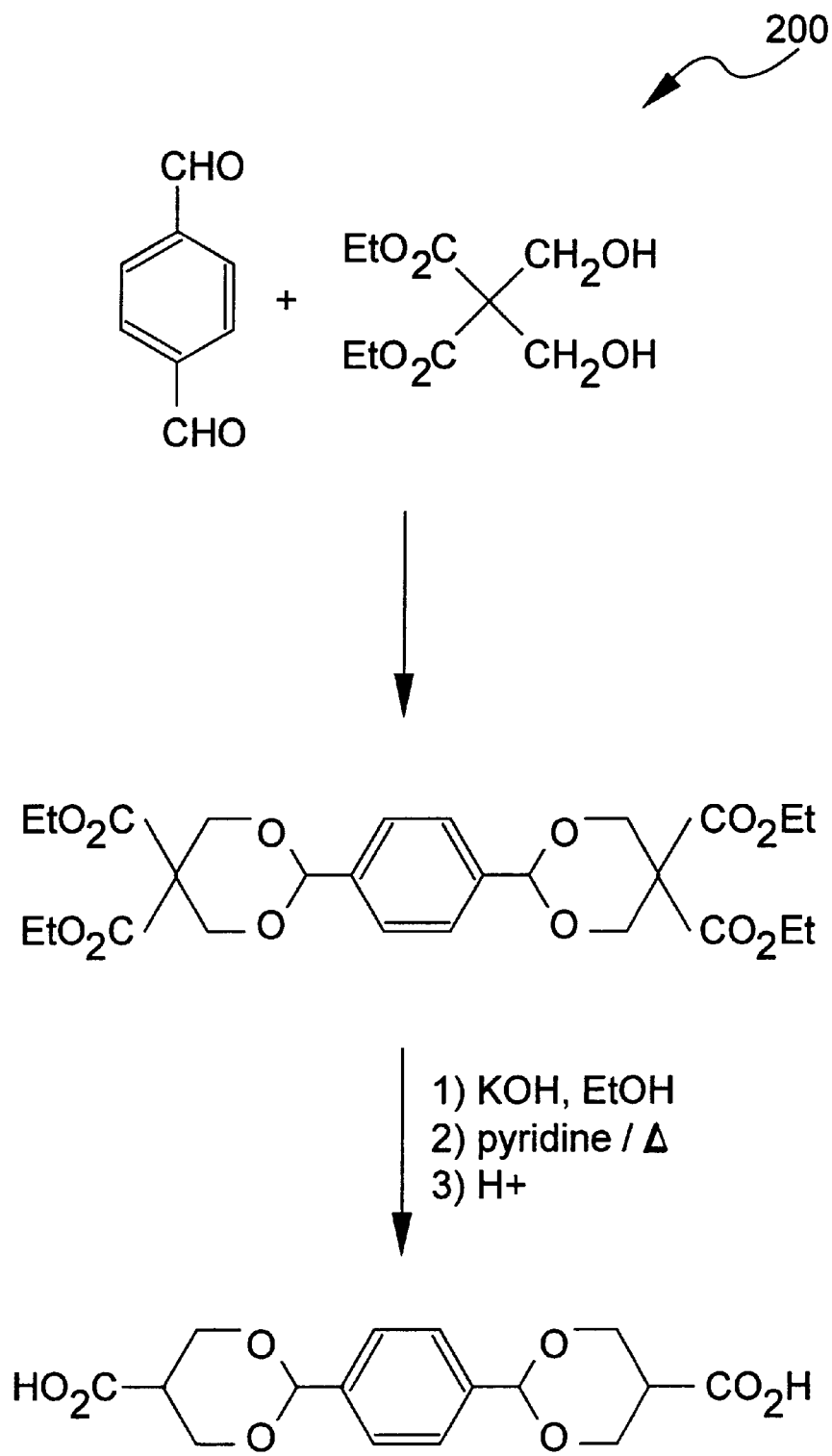

If PIO is selected as the water soluble resin, then the cross-linker is preferably an organic diacid having a functionality that affords acid-cleavable cross-linking of the PIO. More preferably, the cross-linker includes carboxylic acid groups as the organic diacid and an acetal functionality as the acid-cleavable functionality. As a less preferred alternative to such an acetal diacid, the cross-linker may also be a ketal diacid. The acetal or ketal functionality thus provides reversal of the PIO cross-linking when exposed to an acid to hydrolyze the acetal or ketal group and yield two alcohol functionalities and an aldehyde or a ketone. More preferably, the cross-linker comprises the organic diacid shown as an initial reactant in mechanism 100 of FIG. 1. An onium salt, as well as other PAGs known to those skilled in the art, may be a suitable PAG. The $R^1$ group shown for the organic diacid in mechanism 100 may be any group compatible with the requirements of the present invention set forth herein, but preferably is selected from among biphenyl, phenyl, and $(CH_2)_a$, wherein a is any integer from 1 to 12, more preferably from 3 to 5. Such an organic diacid may be synthesized according to mechanism 200 shown in FIG. 2 which, by way of example, uses 4-formyl-benzaldehyde to produce a dicarboxylic acid.

In mechanism 100, a water soluble resin, PIO, is exposed to thermal energy in the presence of the organic diacid cross-linker indicated. This may essentially be termed a "pre-baking" step to reversibly cross-link the water soluble resin rendering it water insoluble before applying a PPR. The temperature and the duration of pre-baking will depend upon the particular types and amounts of components selected for the composition used to form a radiation adsorbing layer, as well as other factors known to those skilled in the art. The resulting cross-linked structure shown in mechanism 100 may be made water soluble through exposure of the structure to acid and thermal energy. While not shown, it is also conceivable that acid exposure alone would be sufficient. In the present invention, this means that the step of rendering the ARC water soluble may take a variety of different forms. Preferably, the step of rendering the PIO ARC water soluble includes exposing the ARC to an acid solution or an acid vapor, which would not require that the ARC be photosensitive.

Alternatively, the step of rendering the ARC water soluble may include exposure to actinic radiation, as would be the case if a PAG is a part of the initial composition, although this is less preferred. The PIO is sufficiently basic that it may interfere with the acid catalyzed acetal or ketal cleavage when the ARC is exposed to actinic radiation, generating acid from a PAG, followed by exposure to thermal energy. As a result, the PIO ARC is not easily rendered water soluble by a PAG-generated acid. An excess of acid is preferred to counteract the basicity of the PIO. Such an acid excess is preferably provided by processing the ARC in an acid solution without reliance on actinic radiation. Thus, the step of rendering the ARC water soluble after developing the PPR layer may simply include the steps of rinsing with an acid solution and baking the ARC. Given the requirements described herein for the radiation adsorbing layer, yet other steps for rendering the ARC water soluble are conceivable.

Figure 3:
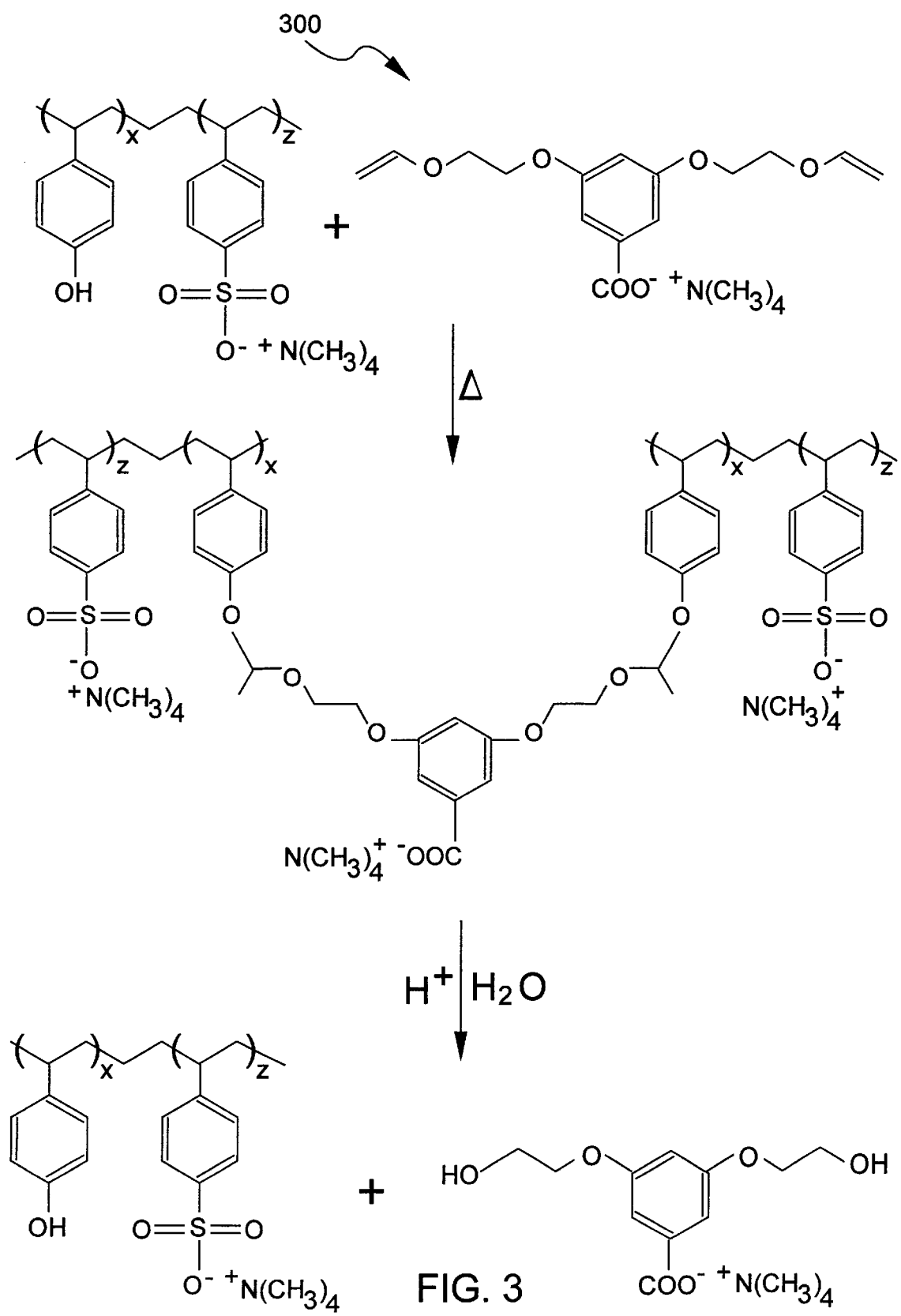

Similar to PIO, a cross-linker used with the HSS copolymer is preferably a compound having a functionality that affords acid-cleavable cross-linking of the HSS copolymer. If HSS copolymer is a selected as the water soluble resin, then a water soluble divinyl ether cross-linker as shown as an initial reactant in mechanism 300 in FIG. 3 is preferred. The cationic portion of the HSS copolymer in mechanism 300 is preferably $N(CH_3)_4^+$ as shown, however, it may be any suitable compound known to those skilled in the art or, less preferably, $NH_4^+$. The ratio of hydroxystyrene to sulfonated styrene in the HSS copolymer is indicated in FIG. 3 by subscripts x and z, wherein x is preferably 0.4 to 0.8 and y is preferably 0.2 to 0.6. More preferably, x is 0.6 and y is 0.4. It is also more preferable that x+z=1.0, however, if the HSS copolymer is modified to a terpolymer or some other structure, then it is conceivable x+z may not total 1.0. Whatever the structure chosen, it is preferred that a sufficient number of cross-linking sites, such as provided by hydroxystyrene, are present and a sufficient number of functionalities providing water solubility, such as provided by sulfonated styrene, are present. A sufficient number are present when the resin provides the advantages of the present invention described herein.

Similar to that shown for mechanism 100, thermal exposure of the HSS copolymer in the presence of a divinyl ether forms the cross-linked structure shown in mechanism 300. The cross-linked structure is similarly acid sensitive due to the ester linkages present. Accordingly, a cross-linked ARC formed from a radiation adsorbing layer that includes HSS copolymer and a divinyl ether may be rendered water soluble using the same variety of steps and options as described above for a radiation adsorbing layer including PIO and an organic diacid. However, unlike PIO, the HSS copolymer will probably not interfere with acid catalyzed ether, acetal, or ketal cleavage generated from a PAG. Preferably then, the step of rendering the ARC water soluble when formed from HSS copolymer includes exposure to actinic radiation, as would be the case if a PAG is a part of the initial composition. Alternatively, the step of rendering the ARC water soluble may include exposing the ARC to an acid solution or an acid vapor, which would not require that the ARC be photosensitive, although this is less preferred.

Figure 4:
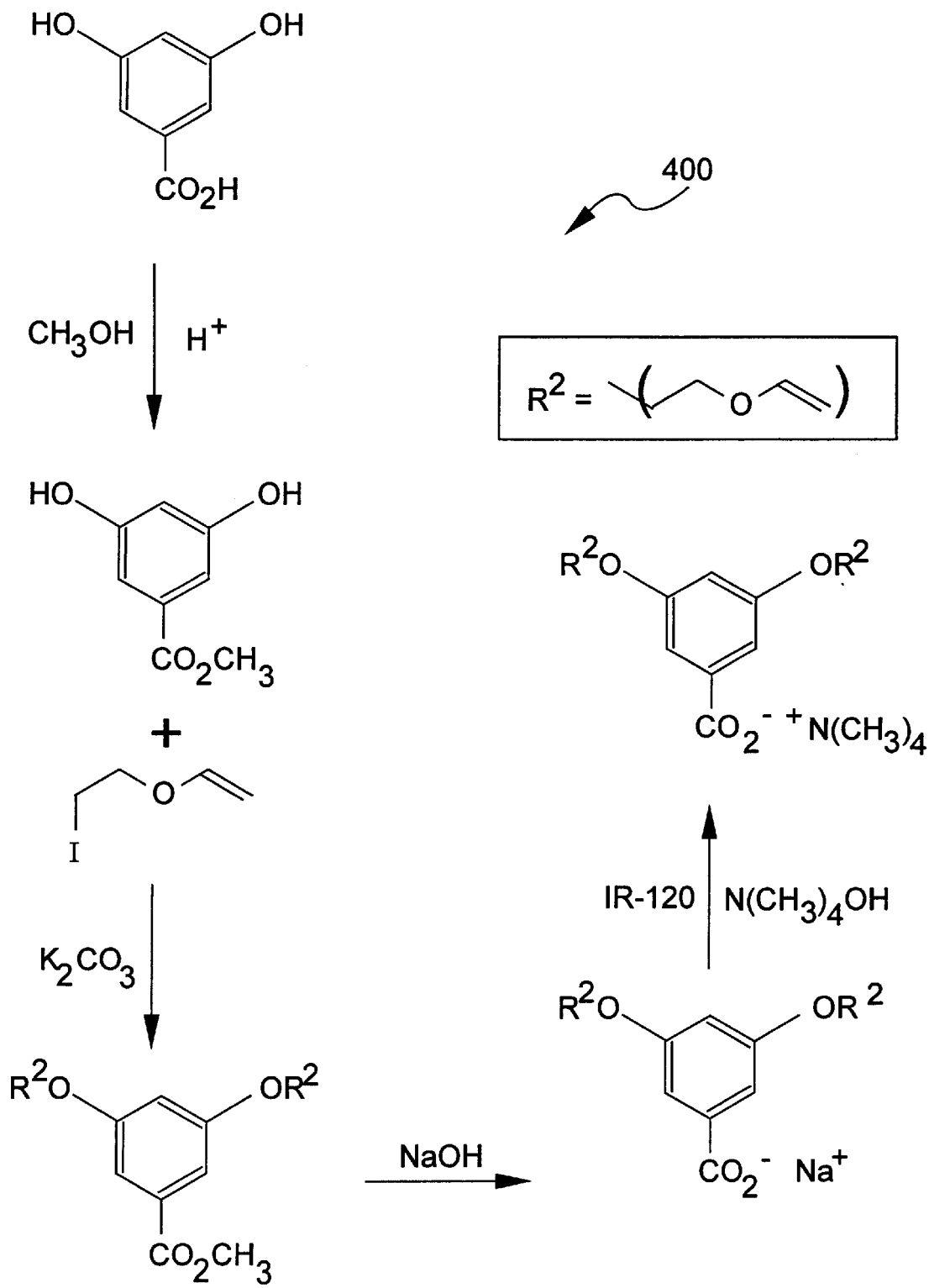
Figure 5:
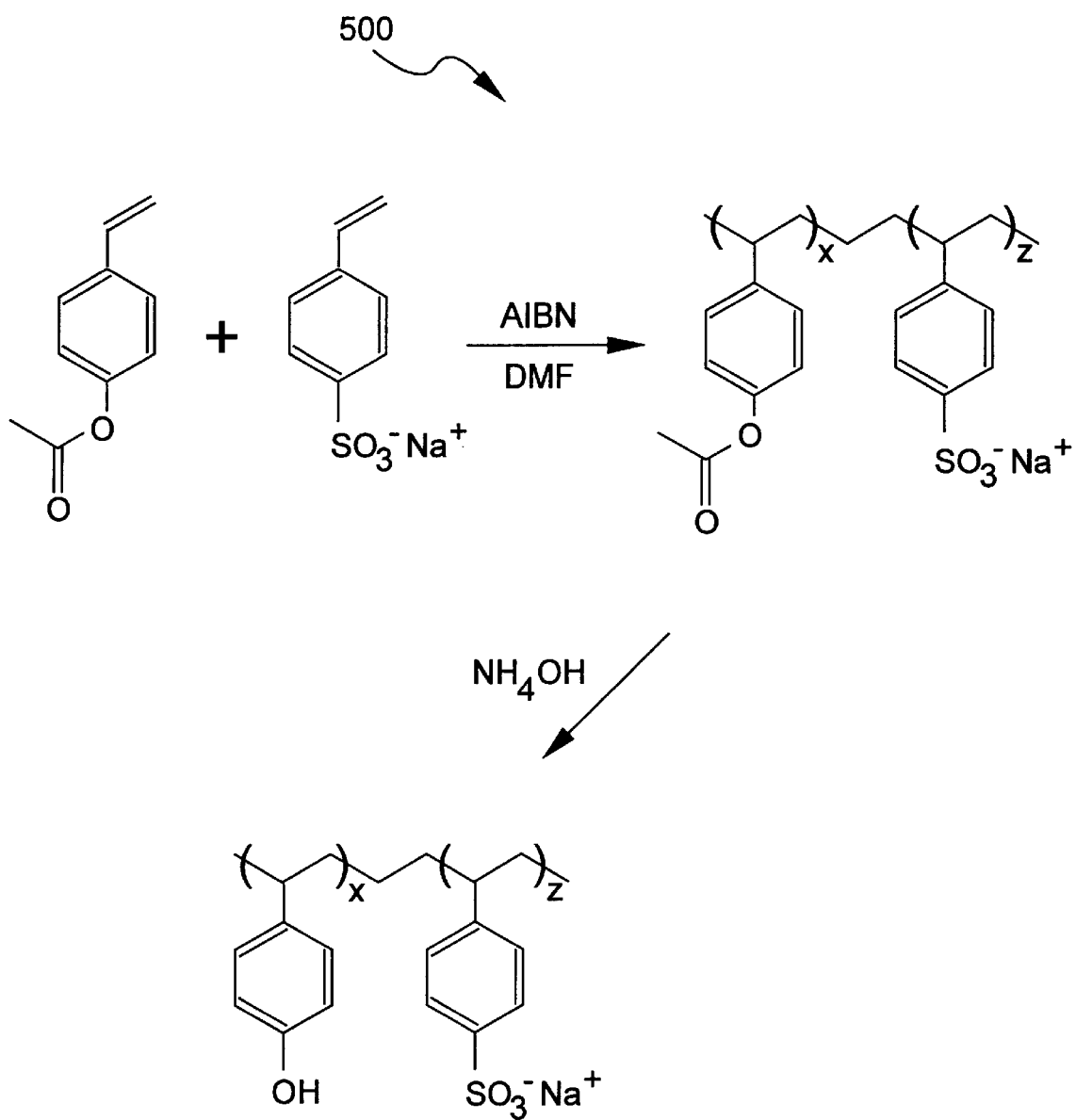

One example of a suitable divinyl ether for use with the HSS copolymer is the bis-vinyl ether prepared from 3,5-dihydroxybenzoate and 2-iodoethyl vinyl ether as shown in mechanism 400 in FIG. 4. In mechanism 400, AMBERLITE (TM) IR-120, an ion exchange resin available from Aldrich Chemical Co. of Milwaukee, Wis., is preferably used as indicated to exchange $Na^+$ for $N(CH_3)_4^+$ in the desired divinyl ether, however, $NH_4^+$ could instead be exchanged as a less preferred alternative. In addition, one example of a suitable HSS copolymer is the copolymer prepared from 4-acetoxystyrene and styrene sulfonic acid as shown in mechanism 500 in FIG. 5. It is also conceivable that various derivatives of the HSS copolymer of mechanism 500 would also provide the advantages of the present invention described herein, as well as other advantages. For example, it may be possible for a chromophore to be incorporated into the HSS copolymer in lieu of providing a separate dye.

Figure 6:
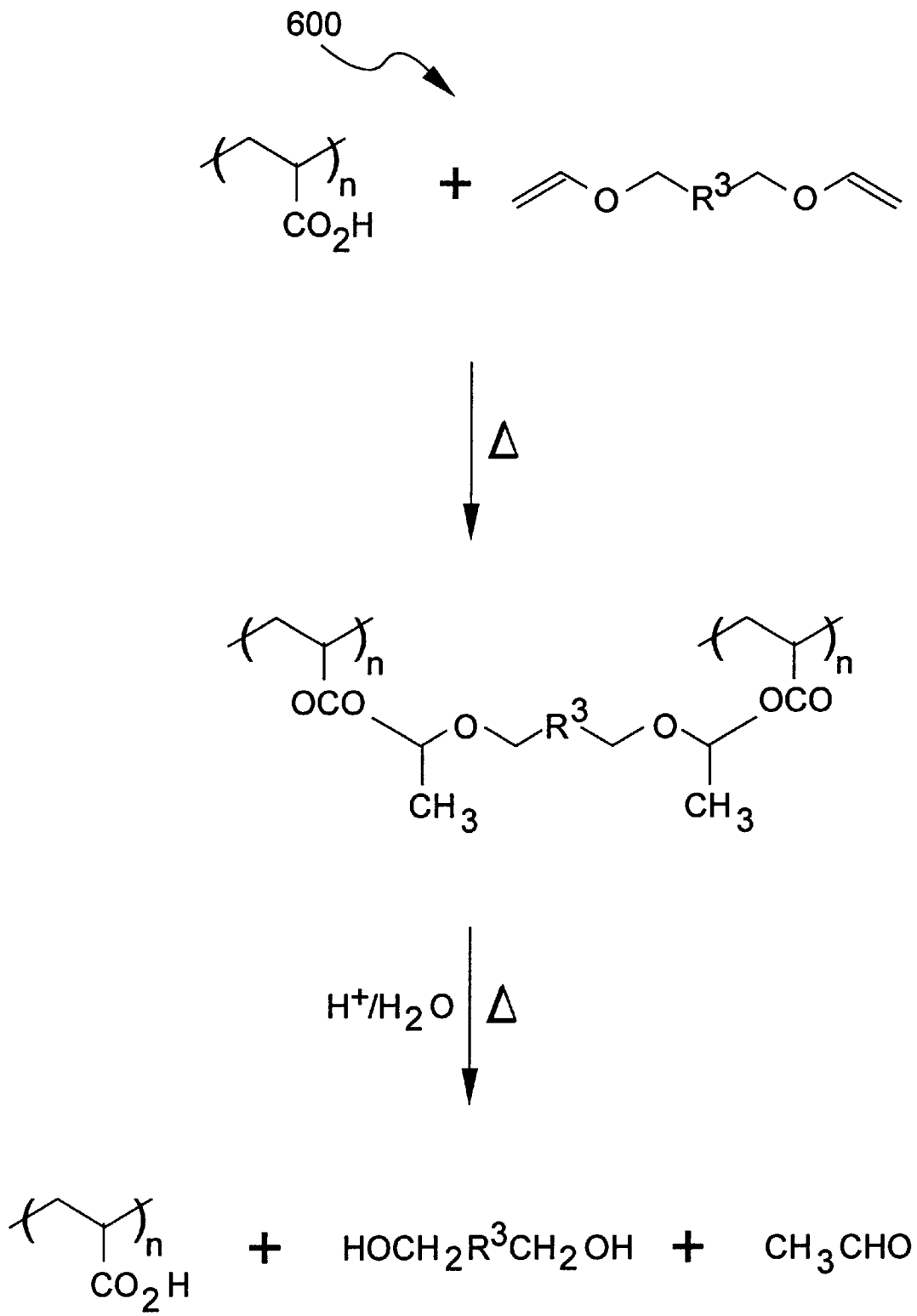

If PAA is selected as the water soluble resin, then a water soluble divinyl ether cross-linker as shown in mechanism 600 in FIG. 6 is preferred. The $R^3$ group shown in the divinyl ether in mechanism 600 includes the same moieties indicated above for the $R_1$ group in the organic diacid shown in mechanism 100. However, more preferably the $R^3$ group for the divinyl ether cross-linker shown in mechanism 600 is selected to provide the bis-vinyl ether of mechanism 300 prepared from 3,5-dihydroxybenzoate and 2-iodoethyl vinyl ether. Similar to that shown for mechanism 100, thermal exposure of the PAA in the presence of a divinyl ether forms the cross-linked structure shown in mechanism 600. The cross-linked structure is similarly acid sensitive due to the ester linkages present. With regard to the present invention, a cross-linked ARC formed from a radiation adsorbing layer that includes PAA and a divinyl ether may be rendered water soluble using the same variety of steps and options as described above for a radiation adsorbing layer including PIO and an organic diacid. A PAA composition for a radiation adsorbing layer may have a shelf life of only a few days due to the acidity of the PAA, accordingly, it is less preferred.

Thus, in a preferred embodiment of the present invention where the water soluble resin includes HSS copolymer, PIO, or PAA, forming an acid sensitive, water soluble ARC will probably require pre-baking as described above. However, it is within the scope of the present invention that derivatives of HSS copolymer, derivatives of PIO, derivatives of PAA, and perhaps other water soluble resins may be reversibly cross-linked to form an ARC without pre-baking. For example, it is conceivable that reversible cross-linking may occur by exposure to actinic radiation or other methods known to those skilled in the art.

Preferably, the composition used to form a radiation adsorbing layer also includes a dye that allows the layer to become an ARC. However, it is conceivable that the water soluble resin may possess properties of itself that allows the radiation adsorbing layer to become an ARC. If the composition used to form a radiation adsorbing layer includes a dye, then the dye is preferably selected from among 9-AM and a derivative of squaric acid having suitable dye properties, with the squaric acid derivative being more preferred. As an option, 9-AM may be chemically combined with the water soluble resin, especially the HSS copolymer, instead of being added to the composition independently. A variety of squaric acid derivatives suitable for the present invention are described in U.S. Pat. No. 5,334,489 issued to Grasshoff et al. and U.S. Pat. No. 5,278,031 issued to Boggs et al., each of which is incorporated herein by reference for its pertinent and supportive teachings.

A squaric acid derivative is more preferred since it is sensitive to a super-acid acting as a catalyst, such that in the presence of a super-acid the squaric acid derivative will decompose to generate squaric acid. A single super-acid molecule will decompose multiple molecules of the squaric acid derivative. If the super-acid is generated by a PAG, then chemical amplification of actinic radiation received by the PAG is provided. In this sense, a squaric acid derivative may be an acid amplifier. The chemical amplification thus enables an ARC to be more photosensitive than otherwise possible, and perhaps more photosensitive than even the PPR applied on the ARC. An ARC photosensitivity equivalent to or matching the PPR photosensitivity is highly unusual given the conventional marginally photosensitive ARCs that require 1.0 Joule/cm$^2$ or more in exposure dose (e.g., U.S. Pat. No. 5,635,333, issued to Petersen et al). Such properties further provide the advantage of allowing the exposure of the PPR to actinic radiation to also act as an exposure of the ARC to actinic radiation. The term "super-acid" is used herein according to its conventional meaning, that is, denoting an acid with a $pK_a$ ($-\log_{10}$ of the acid dissociation constant) less than about 0. The squaric acid derivatives are preferably non-acidic until they are exposed to the super-acids and thermal energy as described in the Grasshoff and Boggs patents referenced above.

Any of the known super-acid precursors, for example diazonium, phosphonium, sulfonium, and iodonium compounds, may be used in the present invention, but more preferably iodonium compounds. Due to the sensitivity of a non-acidic squaric acid derivative to acids, HSS copolymer as opposed to PAA is preferred as the water soluble resin when a squaric acid derivative is used. The combination of PAA (somewhat acidic) with a squaric acid derivative in a composition used to form a radiation adsorbing layer may create a shortened shelf life. Also, HSS copolymer as opposed to PIO is preferred as the water soluble resin when a squaric acid derivative is used. The nitrogen containing ring in PIO will tend to raise the pH of the composition, thus tending to make it more basic, potentially interfering with the acid catalysis.

Preferably, the squaric acid derivatives are squarate salts. Preferably, the superacid catalyst is generated from a PAG. The squaric acid derivative may be included to function as a dye, as an acid amplifier catalyzed by a super-acid, or as both. Consideration must also be given to the compatibility of the squaric acid derivative to the other components of the radiation adsorbing layer and to the processing conditions it will endure. A few suitable squaric acid derivatives that decompose to generate an acid include:

3,4-bis(3-bromo-2,3-dimethylbut-2-oxy)-cyclobut-3-ene-1,2-dione;

3,4-bis-t-butoxy-cyclobut-3-ene-1,2-dione (hereinafter "bis-t-butyl-squarate");

3,4-bis-alpha-methylbenzyloxy-cyclobut-3-ene-1,2-dione (hereinafter "bis-methylbenzyl-squarate"); and 3-amino-4-t-butoxy-cyclobut-3-ene-1,2-dione.

The first listed squaric acid derivative above is preferred since it is thermally stable at the process conditions typically encountered in the method according to the preferred embodiment of the present invention. Also, the first listed squaric acid derivative does not contain any basic complement that might reduce the strength of the super-acid or squaric acid. Further, the first listed squaric acid derivative may function both as a dying and as an acid amplifier. The bis-t-butyl-squarate is less preferred since it will begin to decompose to acid at 90 C in the absence of any acid catalysis. Some of the baking steps in a typical photo resist processing method would occur near approximately 90 C, making bis-t-butyl-squarate less compatible with typical photo resist processing.

After applying a radiation adsorbing layer and forming an acid sensitive, water insoluble ARC, a PPR layer is applied on the ARC. As known to those skilled in the art, it is preferred that the ARC does not intermix with the PPR layer. If the ARC is rendered water insoluble by cross-linking as described above, then intermixing with the PPR layer may be avoided. However, since other mechanisms of providing a water insoluble ARC are conceivable and within the scope of the present invention, it is preferred that such alternative mechanisms avoid intermixing with the PPR layer or at least minimize such intermixing to an acceptable level. Notably, 9-AM is solvent soluble and a squaric acid derivative is water soluble. Thus, if 9-AM is used as a dye, then the radiation adsorbing layer should be cast from an organic solvent, as opposed to a water solution. Even though most PPR layers are also cast from an organic solvent, intermixing may nevertheless be avoided, in particular, if the resulting ARC is formed and rendered water insoluble by cross-linking as described above when HSS copolymer, PIO, or PAA are used as the water soluble resin. In addition, when the ARC is later rendered water soluble, development of the ARC with an aqueous solution, such as de-ionized water, will operate properly since the loading of the 9-AM will not be sufficiently high to preclude rinsing away in the aqueous developer.

After the PPR layer is applied on the ARC, selected portions of the PPR layer are exposed to actinic radiation, using methods known to those skilled in the art, to form a resist image. Notably, a preferred embodiment of the present invention provides that the exposure of the PPR layer may be selected such that it affects only the PPR layer or that it simultaneously affects the PPR layer and the ARC. Thus, in a first scenario, the PPR layer is exposed while the ARC reduces reflection by adsorbing radiation, the PPR layer is developed, the ARC is rendered water soluble only after being uncovered by development of the PPR layer, and the ARC is then developed to uncover selected portions of the substrate. Thus, the PPR layer is exposed to radiation separately from the step of rendering the ARC water soluble and the PPR layer is also developed separately from development of the ARC. However, it is within the scope of the present invention that the steps of exposing the PPR layer to radiation and rendering the ARC water soluble occur together in a single exposure to actinic radiation. Also, it is within the scope of the present invention that the steps of developing the PPR layer and developing the ARC occur together in a single develop. Thus, there are at least three other scenarios within the scope of the present invention. In a second scenario, the PPR and ARC are exposed to radiation simultaneously and developed simultaneously. In a third scenario, the PPR and ARC are exposed to radiation simultaneously, but developed separately. In the fourth scenario, the PPR and ARC are exposed to radiation separately, but developed in a single develop. As indicated below, there are yet other variations in the method according to the present invention that provide still further scenarios.

In the first scenario described above, a variety of methods may be used to render the ARC water soluble. After the resist image is formed during development of the PPR layer to uncover selected portions of the ARC, blanket exposure to actinic radiation and baking of the ARC may render the ARC water soluble, allowing subsequent development of the ARC in an aqueous developer, more preferably de-ionized water. Alternatively, the ARC may be rendered water soluble by exposure to an acid solution or an acid vapor after development of the resist image in the PPR layer. As a further alternative, blanket exposure with an infrared (IR) laser may be used to selectively render the ARC water soluble as it heats the ARC by radiation rather than by other thermal means. The IR radiation triggers thermally activated acid generators. Following blanket exposure with the IR laser, the step of developing the ARC need only include rinsing with de-ionized water. As yet another alternative, the ARC may be exposed to a different wavelength of light than used in the exposure of the PPR layer to which the PPR layer is not sensitive, such as deep ultraviolet (DUV) (e.g., 190–315 nanometer (nm) wavelength) radiation, in particular, 193 nm radiation. For example, the PPR could be exposed at 248 nm and the ARC exposed at 193 nm. Only the ARC would be sensitive to the 193 nm radiation and to the PPR would be unaffected. Further, the PPR could be exposed at 248 nm and the ARC exposed at a longer wavelength, such as visible light or IR radiation.

In each of the alternatives, it is preferred that the PPR layer be selected such that it is not sensitive to the step of rendering the ARC water soluble. For example, in U.S. Pat. No. 5,635,333, issued to Petersen et al., an ARC is disclosed that is susceptible to a solvent solubilizing reaction, but the PPR layer disclosed therein is also susceptible to such reaction. Accordingly, in Petersen et al., the PPR layer must be hardened to avoid rendering it solvent soluble when the ARC is rendered solvent soluble. In the present invention, it is preferred that the step of rendering the ARC water soluble does not require hardening of the PPR layer to prevent an impact thereon. However, it is conceivable that a method within the scope of the present invention might require hardening, though it is clearly not preferred.

In each of the alternatives, it is preferred that the PPR layer be selected such that it is not sensitive to the step of developing the ARC. More preferably, this simply means that the PPR layer is compatible with a de-ionized water rinse. In keeping with the principles described above, other mechanisms for rendering the ARC water soluble after development of a resist image in the PPR layer are conceivable.

While not preferred, it is conceivable according to the second and third scenario described above that a wavelength of actinic radiation may be used such that the step of exposing the PPR layer to radiation and rendering the ARC water soluble occur together in a single exposure. Subsequently, in the second scenario, because the ARC is water soluble, the PPR layer and ARC may be developed simultaneously using a standard tetramethyl ammonium hydroxide (TMAH) developer or other aqueous PPR layer developer. Alternatively, in the third scenario, the PPR layer may be developed first, followed by development of the ARC, preferably with de-ionized water.

Such a method of simultaneous exposure is not preferred since the ARC is radiation adsorbing and will probably not produce a high-resolution image due to the gradient in exposure level down through the PPR layer and ARC as the radiation is absorbed. Nevertheless, if the ARC is a thin film, then such effects are probably secondary and any reduction in image resolution might be negligible. It is desirable for simultaneous exposure to use an ARC that operates on the principles of chemical amplification, which may be provided in a variety of ways, as known to those skilled in the art. In one sense, chemical amplification is enabled when reversal of the ARC cross-linking results from catalytic cleavage by a photo acid. A single acid catalyst molecule generated in this manner may be capable of cleaving multiple cross-links, thus allowing lower exposure doses for the needed photo chemical response. In another sense, chemical amplification is enabled if photo sensitivity is further enhanced when a material in the ARC decomposes in the presence of a photoacid to make more acid, amplifying the actinic radiation that reaches the ARC as it passes through the PPR layer above. Photo sensitivity may also be further enhanced by other mechanisms to enable simultaneous exposure, such as when a base is omitted from the ARC, higher loading of a PAG is provided, and the water soluble resin only requires an activation energy of about 100 mJ/cm$^2$ or less. By these various mechanisms, the efficiency of the photo acid generated upon exposure can be amplified and/or enhanced, allowing the ARC to respond to reletively lower levels of actinic radiation than the PPR.

While not preferred, it is conceivable according to the fourth scenario described above that different wavelengths of actinic radiation may be used such that the steps of exposing the PPR layer and the ARC to radiation occur separately at different exposure wavelengths, but without removal of the PPR layer as described in the first scenario. Next, the PPR layer may be developed first, followed by development of the ARC, preferably with de-ionized water.

As a variation on the four scenarios described above, a fifth scenario is also within the scope of the present invention. In the fifth scenario, the PPR layer is exposed to radiation, a single step is used both to develop the PPR and render the ARC water soluble, and a separate step is used to develop the ARC. A method operating under such a scenario is enabled by a PPR that may be developed by an aqueous acid, rather than the typical aqueous base, such that as the resist image forms in the PPR layer the ARC will be uncovered and exposed to the aqueous acid developing the resist image. Since the radiation adsorbing layer according to a preferred embodiment of the present invention is acid sensitive, the cross-linking of the layer to form the ARC may be reversed, rendering the ARC water soluble. A composition used to form a radiation adsorbing layer under this fifth scenario, would not require the presence of a PAG since it would rely upon external acid rather than photo generated acid to cleave the cross-links. It is anticipated that a thin ARC will be exposed more effectively to the acid solution than a thick ARC. Also, if the ARC is too thick, the acid will tend to diffuse laterally into the ARC layer, undercutting the PPR lines. In most applications, a suitably thin ARC is preferably in the range of approximately 400–450 Angstroms thick. In compositions presently envisioned for use as the radiation adsorbing layer, exposing the ARC to thermal energy, for example by baking, will complete the step of rendering the ARC water soluble. However, it is conceivable that compositions may be developed that do not require thermal energy exposure.

In keeping with the above described variations, the following alternatives to a preferred embodiment of the present invention are considered more preferred. A first more preferred method includes the steps of applying a radiation adsorbing layer on a substrate and forming an acid sensitive, water insoluble ARC therefrom, applying a PPR layer on the ARC, exposing selected portions of the PPR layer to actinic radiation, and developing the PPR layer to uncover selected portions of the ARC. Once portions of the PPR layer are moved to form a resist image, the ARC is rendered water soluble by blanket exposing with actinic radiation and baking the ARC. The ARC may then be developed with de-ionized water.

In a second more preferred embodiment of a method according to the present invention, a composition is used to form a radiation adsorbing layer that will produce a cross-linked, water insoluble ARC that is more photosensitive then the PPR layer. Accordingly, suitable chemical amplification components will generally be required. A photosensitivity of about 20 mJ/cm² is most preferred, although a higher required exposure dose may still be suitable. The method includes the steps of applying a radiation adsorbing layer on the substrate and forming an acid sensitive, water insoluble ARC therefrom, applying a PPR layer on the ARC, exposing the PPR layer and rendering the ARC water soluble in a single exposure to actinic radiation, and developing the PPR layer and the ARC together in a single develop.

A third more preferred embodiment of the present invention is a method including the steps of applying a radiation adsorbing layer on a substrate and forming an acid sensitive, water insoluble ARC therefrom, applying a PPR layer on the ARC, exposing selected portions of the PPR layer to actinic radiation, developing the PPR layer and rendering the ARC water soluble in a single develop using an acid solution rinse, baking the ARC, and rinsing with de-ionized water to remove the ARC. Notably, this method does not require a blanket exposure to actinic radiation.

In a fourth more preferred embodiment of a method according to the present invention, a composition is used to form a radiation adsorbing layer that will produce a cross-linked, water insoluble ARC that is more thermally sensitive, rather than photosensitive. Accordingly, suitable thermally activated, acid generating components will generally be required. The method includes the steps of applying a radiation adsorbing layer on a substrate and forming an acid sensitive, water insoluble ARC therefrom, applying a PPR layer on the ARC, exposing selected portions of the PPR layer to actinic radiation, and developing the PPR layer to uncover selected portions of the ARC. Once the resist image is formed, a blanket IR laser expose is used to heat the ARC, rendering it water soluble, and a de-ionized water rinse is then used to remove the ARC.

A fifth more preferred embodiment includes the steps of applying a radiation adsorbing layer on a substrate and forming an acid sensitive, water insoluble ARC therefrom, applying a PPR layer on the ARC, exposing selected portions of the PPR layer to actinic radiation, developing the PPR layer to uncover selected portions of the ARC, blanket exposing the ARC at a shorter wavelength than used to expose the PPR layer, rendering the ARC water soluble, and rinsing with de-ionized water to develop the ARC.

In each of the five more preferred methods described above, it is most preferred that the step of forming a water insoluble ARC comprises pre-baking the radiation adsorbing layer to reversibly cross-link a water soluble resin. It is also most preferred in each of the five more preferred methods, that the steps of rendering the ARC water soluble and developing the ARC both occur without any hardening of the PPR layer.

A first more preferred composition according to the present invention includes poly HSS copolymer as a water soluble resin and a water soluble divinyl ether as a cross-linker. A second more preferred composition includes PIO as a water soluble resin and an acetal diacid as a cross-linker. A third more preferred composition includes PAA as a water soluble resin and a water soluble divinyl ether as a cross-linker. Each composition most preferably includes a dye selected from among 9-AM and a squaric acid derivative. Also, the composition most preferably includes a suitable PAG and other chemical amplification components required for the composition to exhibit a photosensitivity of less than about 900 mJ/cm², or more preferably about 100 mJ/cm² or less.

In light of the disclosure herein, it will be apparent to those skilled in the art that a wide variety of compositions may be developed for use with a wide variety of methods of the present invention. Some of such compositions and methods are described above. In addition, the following examples are provided:

EXAMPLE 1

A formulation including PIO, a di-carboxylic acid cross-linker (25% by weight) containing acetal linkages (derived from 4-formyl-benzaldehyde), and a dye (5% by weight, such as bis-tetramethyl ammonium squarate) was prepared in a water solution (13% total solids). The solution was spin cast on a wafer substrate and pre-baked at 110 C for 5 minutes. During the pre-bake, the di-carboxylic acid cross-linked with the PIO, rendering the film insoluble in aqueous and solvent solutions. A PPR, such as IBM CGR (or others such as Apex E or UV2) was spin applied, forming a 0.5 µm thickness over the baked ARC film. The CGR resist was baked at 95 C for 90 seconds. The CGR resist was exposed on a Microscan II with 30 mJ/cm², and post expose baked at 85 C for 90 seconds. After the CGR resist pattern was developed in 0.14 N aqueous TMAH for 60 seconds, the ARC was exposed to acid in a water solution, such as 2% by weight toslic acid in water, at 25 C for 2 minutes. The acid was absorbed into the ARC film, neutralizing the basic resin and providing an acid source to cleave the cross-linking groups. After the acid dip, the wafer was baked at 120 C for 90 seconds and rinsed with water for 60 seconds to remove the uncovered ARC. The post expose bake was processed at a relatively low temperature for each resist, to minimize the amount of chemical amplification in the resist. For example, the CGR is baked at 85 C for 90 seconds, the UV2 is baked at 110 C for 90 seconds, or the Apex E is baked at 70 C for 90 seconds. With this type of ARC, it is important to minimize the use of chemical amplification due to interference with the resist chemistry from the amines in the ARC resin.

EXAMPLE 2

A copolymer of hydroxy-styrene and sulfonated styrene (0.6 to 0.4 ratio of hydroxy-styrene to sulfonated styrene) was combined in water solution with a water soluble bis-vinyl ether (prepared from 3,5-dihydroxybenzoate and 2-iodoethyl vinyl ether), a water soluble photo acid generator such as p-methoxyphenyl, dimethyl sulfonium triflate, and a dye such as bis-tetramethylammonium squarate. A small amount of base, such as 0.2% by weight tetra-butyl ammonium hydroxide was added to stabilize the formulation and enhance shelf life. The solution was spin cast on a wafer substrate and baked at 120 C for 10 minutes. During the bake, the vinyl ether cross-linked with the hydroxy groups of the styrene polymer, rendering the film insoluble in aqueous and solvent solutions. A PPR was spin applied over the ARC layer and soft baked. For example, 0.5 µm of IBM CGR (available from Shipley, Inc. in Marlboro, Mass.) may be applied followed by a post apply bake at 90 C for 90 seconds. The PPR was then exposed with a DUV expose tool, such as a Micrascan II at 20 mJ/cm². A post expose bake was performed at 95 C for 90 seconds to alter the solubility of the PPR layer in the exposed areas and the resist image was developed with aqueous 0.14 N TMAH for 60 seconds. Other resists that could be used are Shipley UV2 and Apex E. The ARC layer was exposed at 193 nm at 100 mJ/cm² using the PPR layer as a mask, post expose baked at 90 C for 60 seconds, and developed with water for 60 seconds. The relative amounts of these components in the formulation was 20% vinyl ether cross-linker, 5% photo acid generator, and 5% squarate salt, on a weight basis. The total solids in the aqueous solution was 13% prior to apply.

EXAMPLE 3

A copolymer of hydroxy-styrene and sulfonated styrene (0.6 to 0.4 ratio of hydroxy-styrene to sulfonated styrene) was combined in a solvent such as propylene glycol methyl ether acetate (PGMEA) with a water soluble bis-vinyl ether (prepared from 3,5-dihydroxybenzoate and 2-iodoethyl vinyl ether), a photo acid generator such as triphenyl sulfonium triflate, and an acid sensitive squarate material, such as 3,4-bis (3-bromo-2,3-dimethylbut-2-oxy)-cyclobut-3-ene-1, 2-dione as both a dye and an acid amplifier. A hindered amine base, such as Coumarin 1(7-diethylamino-4-methyl coumarin) at a 0.2% loading by weight, was added as a stabilization material to prolong the shelf life of the formulation. The solution was spin cast on a wafer substrate and baked at 115 C for 10 minutes. During the bake, the vinyl ether cross-linked with the hydroxy groups of the styrene polymer, rendering the film insoluble in aqueous and solvent solutions. A PPR was spin applied over the ARC layer and soft baked. For example, 0.5 µm of IBM CGR may be applied followed by a post apply bake at 90 C for 90 seconds. The PPR was then exposed with a DUV expose tool, such as a Micrascan II at 20 mJ/cm$^2$. A post expose bake was performed at 95 C for 90 seconds to alter the solubility of the PPR layer in the exposed areas and the resist image was developed with aqueous 0.14 N TMAH for 60 seconds. Other resists that could be used are Shipley UV2 (with a soft bake of less than 120 C) and Apex E. The ARC layer was exposed at 193 nm at 50 mJ/cm$^2$ using the PPR layer as a mask, post expose baked at 90 C for 60 seconds, and developed with water for 60 seconds. If a positive tone DUV resist is selected, then partial exposure of the ARC will occur or during the imaging expose, resulting in thinning of the ARC during development of the PPR layer. It is possible that this partial development of the ARC may allow elimination of the 193 nm expose the step. The relative amounts of these components in the formulation was 20% vinyl ether cross-linker, 5% photo acid generator, and 5% squarate salt, on a weight basis. The total solids in the aqueous solution was 13% prior to apply.

While the invention has been particularly described with reference to preferred embodiments thereof, it will be understood by those skilled in the art that various changes in form and details may be made therein without departing from the spirit and scope of the invention. Unless otherwise specified, any sequence of steps of the method indicated herein are given as an example of a possible sequence and not as a limitation. Further, the reaction mechanisms described herein are given as broad examples of general mechanisms and not as limitations or representations of complete, stoichiometric reactions.

What is claimed is:

1. A method comprising the steps of:
    applying a radiation adsorbing layer on a substrate and forming an acid sensitive, water insoluble antireflective coating (ARC) therefrom;
    applying a photopatterning resist (PPR) layer on the ARC;
    exposing selected portions of the PPR layer to actinic radiation;
    developing the PPR layer to uncover selected portions of the ARC;
    rendering the ARC water soluble; and
    developing the ARC to uncover selected portions of the substrate.

2. The method of claim 1, wherein the radiation adsorbing layer comprises a dye selected from the group consisting essentially of 9-anthracene methanol and a squaric acid derivative.

3. The method of claim 1, wherein the radiation adsorbing layer comprises a water soluble resin and a cross-linker.

4. The method of claim 3, wherein the water soluble resin comprises a compound selected from the group consisting essentially of hydroxystyrene-sulfonated styrene copolymer, poly(2-isopropenyl-2-oxazoline), and poly(acrylic acid).

5. The method of claim 3, wherein the cross-linker comprises a compound selected from the group consisting essentially of an acetal diacid and a water soluble divinyl ether.

6. The method of claim 1, wherein the radiation adsorbing layer is chemically amplified.

7. The method of claim 1, wherein the ARC exhibits a photosensitivity of less than about 900 millijoules per square centimeter.

8. The method of claim 1, wherein the step of developing the ARC comprises developing with a water rinse.

9. The method of claim 8, wherein the step of rendering the ARC water soluble comprises exposing the ARC to an acid solution or an acid vapor.

10. The method of claim 9, wherein the step of rendering the ARC water soluble comprises the steps of:
    developing the PPR layer by rinsing with an acid solution and thus exposing the ARC to the acid solution; and
    baking the ARC.

11. The method of claim 8, wherein the step of rendering the ARC water soluble comprises exposing with a wavelength of light different from that used in the step of exposing the PPR layer without first hardening the PPR layer.

12. The method of claim 11, wherein the step of exposing the PPR layer comprises exposing with 248 nanometer radiation.

13. The method of claim 11, wherein the step of rendering the ARC water soluble comprises blanket exposing with an infrared (IR) laser.

14. The method of claim 11, wherein the step of rendering the ARC water soluble comprises the steps of:
    exposing the ARC with 193 nanometer radiation after the step of developing the PPR layer; and
    baking the ARC.

15. The method of claim 1, wherein the steps of exposing the PPR layer and rendering the ARC water soluble occur together in a single exposure to actinic radiation.

16. The method of claim 1, wherein the steps of developing the PPR layer and developing the ARC occur together in a single develop.

* * * * *